(12) United States Patent
Pan (10) Patent No.: US 11,114,149 B2
(45) Date of Patent: Sep. 7, 2021

(54) OPERATION METHODS OF FERROELECTRIC MEMORY

(71) Applicant: Wuxi Petabyte Technologies Co., Ltd., Wuxi (CN)

(72) Inventor: Feng Pan, Fremont, CA (US)

(73) Assignee: WUXI PETABYTE TECHNOLOGIES CO, LTD., Jiangsu (CN)

( * ) Notice: Subject to any disclaimer, the term of this patent is extended or adjusted under 35 U.S.C. 154(b) by 0 days.

(21) Appl. No.: 16/683,173

(22) Filed: Nov. 13, 2019

(65) Prior Publication Data

US 2021/0142838 A1 May 13, 2021

(51) Int. Cl.
*G11C 11/22* (2006.01)

(52) U.S. Cl.
CPC ........ *G11C 11/2275* (2013.01); *G11C 11/221* (2013.01); *G11C 11/2255* (2013.01); *G11C 11/2257* (2013.01)

(58) Field of Classification Search
None
See application file for complete search history.

(56) References Cited

U.S. PATENT DOCUMENTS

| 6,233,170 | B1* | 5/2001 | Yamada | G11C 7/06 365/145 |
|---|---|---|---|---|
| 6,538,914 | B1 | 3/2003 | Chung | |
| 6,724,645 | B1 | 4/2004 | Lanham et al. | |
| 2002/0043676 | A1 | 4/2002 | Ohtsuka et al. | |
| 2004/0233696 | A1 | 11/2004 | Kang | |
| 2017/0263303 | A1* | 9/2017 | Fackenthal | G11C 11/2293 |

FOREIGN PATENT DOCUMENTS

| CN | 1459795 A | 12/2003 |
|---|---|---|
| CN | 1700473 A | 11/2005 |
| CN | 1734665 A | 2/2006 |
| CN | 109074839 A | 12/2018 |
| JP | 2010198668 A | 9/2010 |
| WO | 2005008675 A1 | 1/2005 |

OTHER PUBLICATIONS

International Search Report issued in corresponding International Application No. PCT/CN2020/084573, dated Aug. 12, 2020, 5 pages.
Written Opinion of the International Searching Authority issued in corresponding International Application No. PCT/CN2020/084573, dated Aug. 12, 2020, 5 pages.

* cited by examiner

*Primary Examiner* — J. H. Hur
(74) *Attorney, Agent, or Firm* — Bayes PLLC (57) ABSTRACT

Embodiments of operation methods of ferroelectric memory are disclosed. In an example, a method for reading ferroelectric memory cells is disclosed. The ferroelectric memory cells include a first set of ferroelectric memory cells and a second set of ferroelectric memory cells. In a first cycle, first data in a first ferroelectric memory cell of the first set of ferroelectric memory cells is sensed. In a second cycle subsequent to the first cycle, the sensed first data is written back to the first ferroelectric memory cell, and second data in a second ferroelectric memory cell of the second set of ferroelectric memory cells is simultaneously sensed.

13 Claims, 9 Drawing Sheets

OPERATION METHODS OF FERROELECTRIC MEMORY

BACKGROUND

Embodiments of the present disclosure relate to ferroelectric memory and operation methods thereof.

Ferroelectric memory, such as ferroelectric RAM (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast write performance, and great maximum read/write endurance.

BRIEF SUMMARY

Embodiments of operation methods of ferroelectric memory are disclosed herein.

In one example, a method for reading ferroelectric memory cells is disclosed. The ferroelectric memory cells include a first set of ferroelectric memory cells and a second set of ferroelectric memory cells. In a first cycle, first data in a first ferroelectric memory cell of the first set of ferroelectric memory cells is sensed. In a second cycle subsequent to the first cycle, the sensed first data is written back to the first ferroelectric memory cell, and second data in a second ferroelectric memory cell of the second set of ferroelectric memory cells is simultaneously sensed.

In some embodiments, in a third cycle subsequent to the second cycle, the sensed second data is written back to the second ferroelectric memory cell, and third data in a third ferroelectric memory cell of the first set of ferroelectric memory cells is simultaneously sensed.

In some embodiments, each ferroelectric memory cell of the first set of ferroelectric memory cells stores the same data as a respective ferroelectric memory cell of the second set of ferroelectric memory cells. In some embodiments, the first data is the same as the second data.

In some embodiments, the first set of ferroelectric memory cells and the second set of ferroelectric memory cells are in different locations that can be accessed in parallel.

In some embodiments, durations of the first cycle and the second cycle are the same. In some embodiments, each duration is about 10 ns.

In another example, a method for operating ferroelectric memory cells is disclosed. The ferroelectric memory cells include a first set of ferroelectric memory cells and a second set of ferroelectric memory cells. In a first write cycle, data in a first ferroelectric memory cell of the first set of ferroelectric memory cells and data in a second ferroelectric memory cell of the second set of ferroelectric memory cells are simultaneously sensed. In a second write cycle subsequent to the first write cycle, first data is simultaneously written to the first ferroelectric memory cell and the second ferroelectric memory cell. In a first read cycle, the first data in the first ferroelectric memory cell is sensed. In a second read cycle subsequent to the first read cycle, the sensed first data is written back to the first ferroelectric memory cell, and the first data in the second ferroelectric memory cell is simultaneously sensed.

In some embodiments, in a third write cycle subsequent to the second write cycle, data in a third ferroelectric memory cell of the first set of ferroelectric memory cells and data in a fourth ferroelectric memory cell of the second set of ferroelectric memory cells are simultaneously sensed, and in a fourth write cycle subsequent to the third write cycle, second data is simultaneously written to the third ferroelectric memory cell and the fourth ferroelectric memory cell.

In some embodiments, in a third read cycle subsequent to the second read cycle, the sensed first data is written back to the second ferroelectric memory cell, and the second data in the third ferroelectric memory cell is simultaneously sensed.

In some embodiments, the first set of ferroelectric memory cells and the second set of ferroelectric memory cells are in different locations that can be accessed in parallel.

In some embodiments, durations of the first read cycle and the second read cycle are the same. In some embodiments, durations of the first write cycle and the second write cycle are the same. In some embodiments, each duration is about 10 ns.

In yet another example, a method for operating ferroelectric memory cells is disclosed. The ferroelectric memory cells include a first set of ferroelectric memory cells and a second set of ferroelectric memory cells. In a first write cycle, first data is simultaneously written to a first ferroelectric memory cell of the first set of ferroelectric memory cells and a second ferroelectric memory cell of the second set of ferroelectric memory cells. In a first read cycle, the first data in the first ferroelectric memory cell is sensed. In a second read cycle subsequent to the first read cycle, the sensed first data is written back to the first ferroelectric memory cell, and the first data in the second ferroelectric memory cell is simultaneously sensed.

In some embodiments, in a second write cycle subsequent to the first write cycle, second data is simultaneously written to a third ferroelectric memory cell of the first set of ferroelectric memory cells and a fourth ferroelectric memory cell of the second set of ferroelectric memory cells.

In some embodiments, in a third read cycle subsequent to the second read cycle, the sensed first data is written back to the second ferroelectric memory cell, and the second data in the third ferroelectric memory cell is simultaneously sensed.

In some embodiments, the first set of ferroelectric memory cells and the second set of ferroelectric memory cells are in different locations that can be accessed in parallel.

In some embodiments, durations of the first read cycle and the second read cycle are the same. In some embodiments, each duration is about 10 ns.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) memory device" refers to a semiconductor device with vertically oriented strings of memory cell transistors (referred to herein as "memory strings") on a laterally-oriented substrate so that the memory strings extend in the vertical direction with respect to the substrate. As used herein, the term "vertical/vertically" means nominally perpendicular to the lateral surface of a substrate.

Traditional ferroelectric memory is targeting extremely high endurance application, like $10^{13}$ or higher read/write cycles. In order to achieve this extreme metrics, cell size, sensing margin, and timing are optimized for the end of life condition. For normal applications, acceptable high endurance, high performance, low power, non-volatile, and small cell size are expected in embedded or stand-alone applications. Further to bridge the performance gap between ferroelectric memory and static random-access memory (SRAM) or dynamic random-access memory (DRAM), high speed, good endurance, lower power, non-volatile, and small cell size memories are needed for ferroelectric memory.

Figure 1:
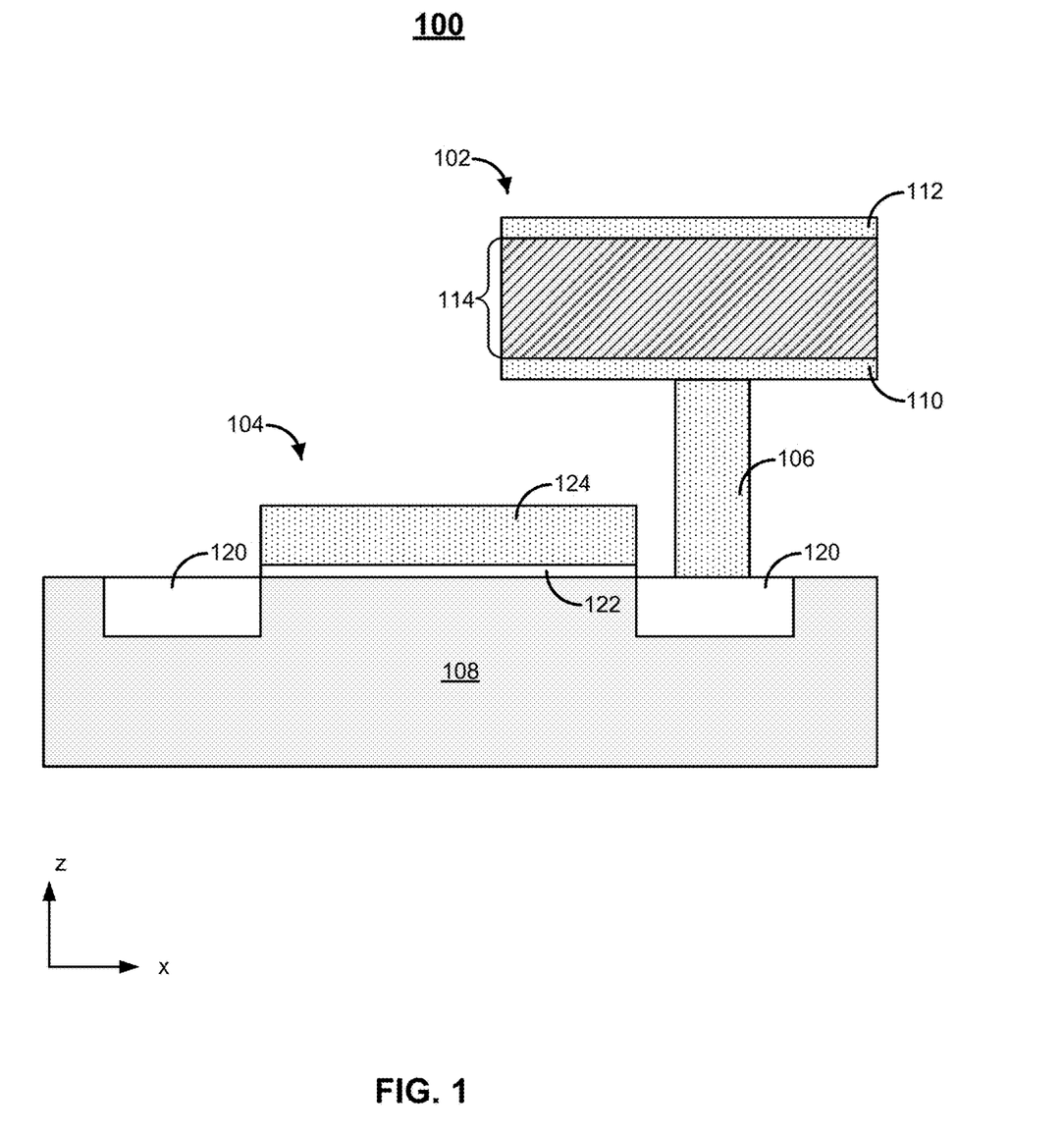
FIG. 1 illustrates a cross-section of an exemplary ferroelectric memory cell, according to some embodiments of the present disclosure.

FIG. 1 illustrates a cross-section of an exemplary ferroelectric memory cell 100, according to some embodiments of the present disclosure. Ferroelectric memory cell 100 is the basic storage element of a ferroelectric memory device and can include various designs and configurations. As shown in FIG. 1, ferroelectric memory cell 100 is a "1T-1C" cell that includes a capacitor 102, a transistor 104, and an interconnect 106 between capacitor 102 and transistor 104 formed on a substrate 108. Substrate 108 can include silicon (e.g., single crystalline silicon), silicon germanium (SiGe), gallium arsenide (GaAs), germanium (Ge), silicon on insulator (SOI) or any other suitable materials.

In some embodiments, capacitor 102 includes a lower electrode 110, an upper electrode 112, and a ferroelectric layer 114 disposed vertically between lower electrode 110 and upper electrode 112. Ferroelectric layer 114 can be in contact with and electrically connected to lower electrode 110 on a lower surface, and in contact with and electrically connected to upper electrode 112 on an upper surface. Lower electrode 110 can be electrically connected to transistor 104 through interconnect 106, and upper electrode 112 can be electrically connected to a voltage source (not shown), such that an electrical field can be applied to ferroelectric layer 114. For ease of description, the example of a 1T-1C cell is illustrated in the present disclosure. In various embodiments, ferroelectric layer 114 can be used in any other suitable types of memory cells with more than one capacitor per cell. For example, ferroelectric layer 114 can also be used in a "2T-2C" cell or a "nT-mC" cell (where n and m are integers). The type of memory cells (e.g., the number of capacitors in a single memory cell) should not be limited by the embodiments of the present disclosure.

The materials of lower electrode 110 and upper electrode 112 can include, but not limited to, at least one of titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), ruthenium oxide (RuOx), iridium (Jr), doped polysilicon, transparent conductive oxides (TCO), or iridium oxide (IrOx). In some embodiments, lower electrode 110 and upper electrode 112 include the same material(s). In some embodiments, lower electrode 110 and upper electrode 112 include different materials. The thickness of lower electrode 110 or upper electrode 112 can be between about 2 nm and about 50 nm, such as between 2 nm and 20 nm (e.g., 2 nm, 3 nm, 4 nm, 5 nm, 8 nm, 10 nm, 15 nm, 18 nm, 20 nm, 25 nm, 30 nm, 35 nm, 40 nm, 45 nm, 50 nm, any range bounded on the lower end by any of these values, or in any range defined by any two of these values). In some embodiments, lower electrode 110 and upper electrode 112 have the same thickness. In some embodiments, lower electrode 110 and upper electrode 112 have different thicknesses.

In some embodiments, ferroelectric layer 114 includes a ferroelectric oxide material. The ferroelectric oxide material can include a ferroelectric composite oxide. In one example, the ferroelectric oxide material may include oxygen and one or more ferroelectric metals. The ferroelectric metals can include, but not limited to, zirconium (Zr), hafnium (Hf), and titanium (Ti). In some embodiments, the ferroelectric metals also include aluminum (Al), nickel (Ni), and/or iron (Fe). In some embodiments, the ferroelectric oxide material includes $HfO_x$. In some embodiments, the ferroelectric oxide material includes oxygen and two or more ferroelectric metals. The molar ratio between two of the ferroelectric metals can be between 0.1 and 10 (e.g., 0.1, 0.2, 0.3, 0.4, 0.5, 0.6, 0.7, 0.8, 0.9, 1, 2, 3, 4, 5, 6, 7, 8, 9, 10, any range bounded on the lower end by any of these values, or in any range defined by any two of these values). In some embodiments, the ferroelectric oxide material includes oxygen and a non-metal material, such as silicon.

In some embodiments, transistor 104 includes source/drain regions 120 and a gate stack having a gate dielectric 122 and a gate conductor 124. Source/drain regions 120 can be doped regions in substrate 108 with n-type or p-type dopants at a desired doping level. Gate dielectric 122 can include dielectric materials, such as silicon oxide ($SiO_x$), silicon nitride ($SiN_x$) or high-k dielectric materials including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. Gate conductor 124 can include conductive materials including, but not limited to, tungsten (W), cobalt (Co), copper (Cu), aluminum (Al), polysilicon, silicides, or any combination thereof. Gate conductor 124 can function as the word line of ferroelectric memory cell 100. An interconnect (not shown) can be in contact with one of source/drain regions 120 that is not in contact with interconnect 106 and function as the bit line of ferroelectric memory cell 100. It is understood that the ferroelectric memory cells disclosed herein are not limited to the example shown in FIG. 1 and may include any planar ferroelectric memory cells or 3D ferroelectric memory cells in any suitable configurations.

Figure 2A:
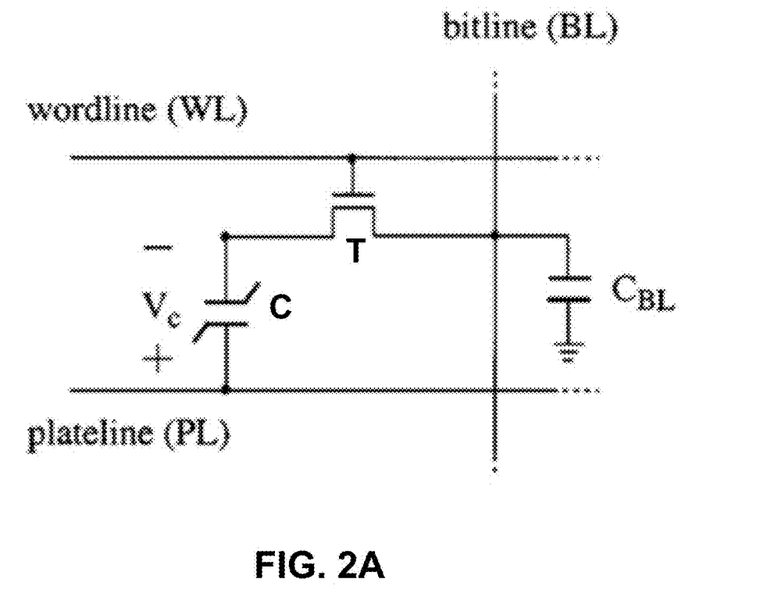
FIG. 2A illustrates a circuit diagram of an exemplary ferroelectric memory cell, according to some embodiments of the present disclosure.

FIG. 2A illustrates a circuit diagram of an exemplary ferroelectric memory cell, according to some embodiments of the present disclosure. The ferroelectric memory cell may be a 1T-1C ferroelectric memory cell, such as ferroelectric memory cell 100 in FIG. 1. The gate of the transistor T is electrically connected to a word line (WL), one of the source and drain of the transistor T is electrically connected to a bit line (BL), and the other one of the source and drain of the transistor T is electrically connected to one electrode of the capacitor C. The other electrode of the capacitor C is electrically connected to a plate line (PL), which can apply a voltage $V_C$ on the capacitor C as shown in FIG. 2A. "$C_{BL}$" represents the total parasitic capacitance of the bit line.

Figure 2B:
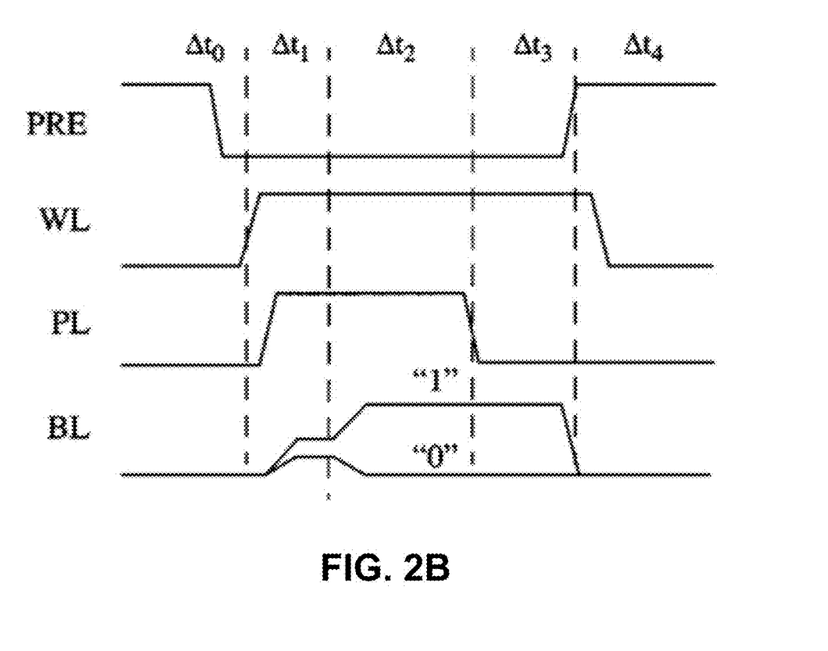
FIG. 2B illustrates a timing diagram of an exemplary read operation of the ferroelectric memory cell in FIG. 2A, according to some embodiments of the present disclosure.

FIG. 2B illustrates a timing diagram of an exemplary read operation of the ferroelectric memory cell in FIG. 2A, according to some embodiments of the present disclosure. The read operation of the ferroelectric memory cell, which is selected by the positive WL signal, in FIG. 2A includes two steps. In the first step, the PL signal switches from low voltage to high voltage, and the data in the ferroelectric memory cell (e.g., the charge stored in the capacitor C) is sensed through the BL signal. As the read operation of ferroelectric memory is "destructive read," which alters the contents of the accessed memory location and needs to be immediately followed by a rewriting of the contents in order to preserve them, in the second step, the PL signal is positive for a fixed time duration and then becomes low voltage, and the sensed data is written back to the ferroelectric memory cell.

As to the write operation of the ferroelectric memory cell, in one example, it also includes two steps: multiple pieces of data are simultaneously sensed from multiple ferroelectric memory cells (e.g., in the same page) in the first step; in the second step, the new data is written to the target ferroelectric memory cell, and other pieces of original data are simultaneously written back to other ferroelectric memory cells in the same page. In another example, additional decoding circuits may be utilized to free the first step, such that the new data can be written to the target ferroelectric memory cell without the prior sensing step.

As described above, normal ferroelectric memory read operations require both sensing and writing-back steps. In terms of performance, the two steps consume similar amount of time due to signal controls. Thus, ferroelectric memory performance in theory should be the same as that of comparable DRAM (e.g., both having 1T-1C configurations).

Various embodiments in accordance with the present disclosure provide operation methods of ferroelectric memory that can achieve better performance than normal ferroelectric memory operations. Multiple sets of ferroelectric memory cells can be used to store identical data. For read operations, interleaving read operations can be performed between two or more sets of ferroelectric memory cells, which can access multiple locations in parallel, to hide the write-back step in successive read operations. As a result, read access time can be reduced, for example, becoming one half of the normal ferroelectric memory read operation.

Figure 3:
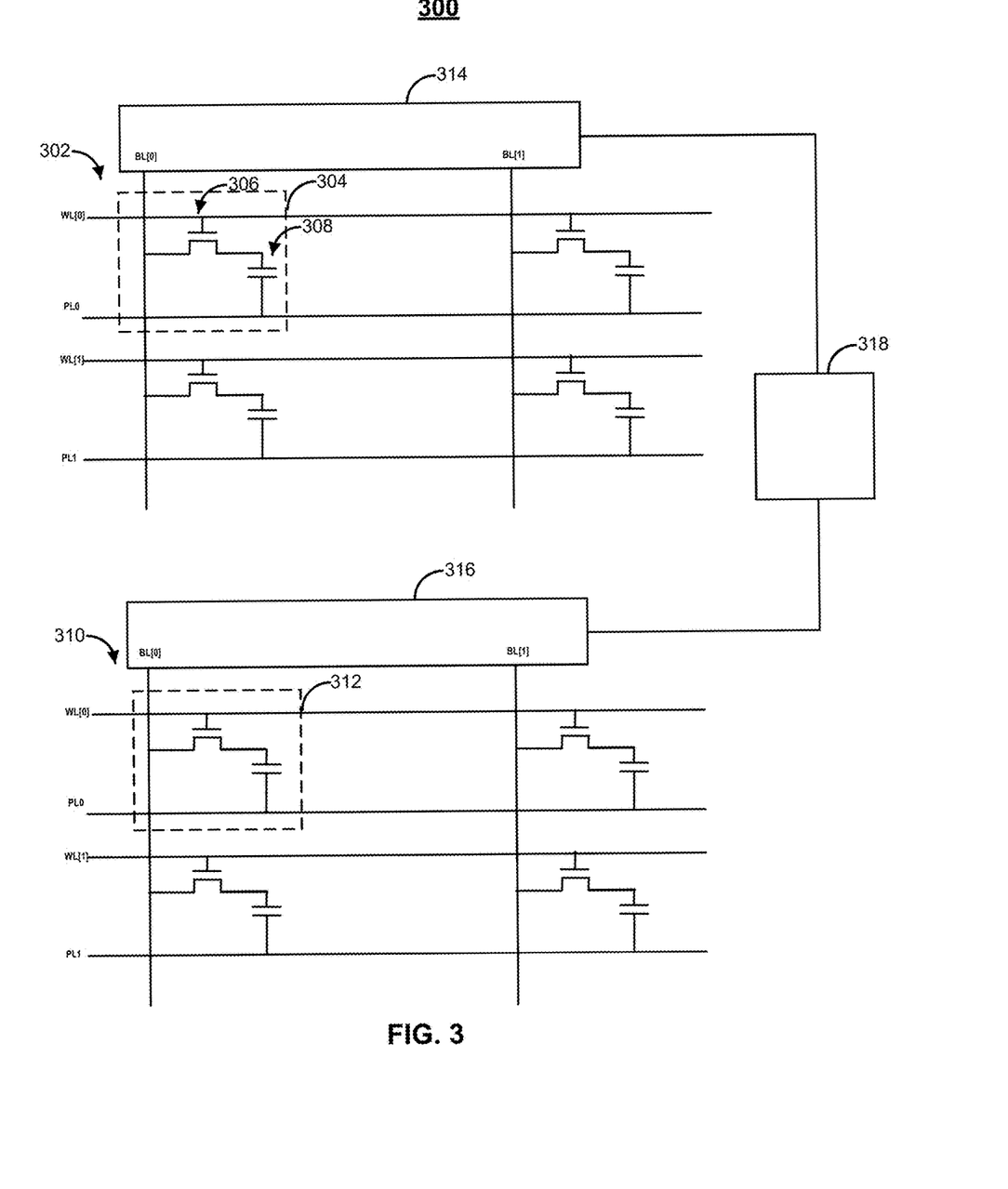
FIG. 3 illustrates a circuit diagram of exemplary ferroelectric memory cells including a first set of ferroelectric memory cells and a second set of ferroelectric memory cells in different locations that can be accessed in parallel, according to some embodiments of the present disclosure.

FIG. 3 illustrates a circuit diagram of exemplary ferroelectric memory cells including a first set of ferroelectric memory cells 302 and a second set of ferroelectric memory cells 310 in different locations that can be accessed in parallel, according to some embodiments of the present disclosure. As shown in FIG. 3, a ferroelectric memory device 300 includes first set of ferroelectric memory cells 302 and second set of ferroelectric memory cells 310. In some embodiments, first and second sets ferroelectric memory cells 302 and 310 are in different locations that can be accessed in parallel. In one example, first and second sets ferroelectric memory cells 302 and 310 are in two memory banks. In another example, first and second sets ferroelectric memory cells 302 and 310 are in two memory planes. In still another example, first and second sets ferroelectric memory cells 302 and 310 are in two memory pages.

In some embodiments, first and second sets ferroelectric memory cells 302 and 310 have the same number of ferroelectric memory cells and configurations. Taking first set of ferroelectric memory cells 302 for example, first set of ferroelectric memory cells 302 can include an array of ferroelectric memory cells 304 arranged in rows and columns. Each ferroelectric memory cell 304 can be a 1T-1C memory cell that includes a transistor 306 and a capacitor 308 as shown in FIG. 3. Each word line WL[0] or WL[1] is electrically connected to the gates of transistors 306 in each ferroelectric memory cell 304 in the same row of the array, and each bit line BL[0] or BL[1] is electrically connected to the sources/drains of transistors 306 in each ferroelectric memory cell 304 in the same column of the array. Each plate line PL0 or PL1 is electrically connected to one electrode of capacitor 308 in each ferroelectric memory cell 304 in the same row of the array. In each ferroelectric memory cell 304, the drain/source of transistors 306 is electrically connected to the other electrode of each of capacitor 308.

In some embodiments, each ferroelectric memory cell 304 of first set of ferroelectric memory cells 302 stores the same data as a respective ferroelectric memory cell 312 of second set of ferroelectric memory cells 310. For example, the first data (i.e., the charge in capacitor 308) in ferroelectric memory cell 304 of first set of ferroelectric memory cells 302 may be the same as the second data (i.e., the charge in the capacitor) in ferroelectric memory cell 312 of second set of ferroelectric memory cells 310. In other words, each ferroelectric memory cell 312 of second set of ferroelectric memory cells 310 can mirror a respective ferroelectric memory cell 304 of first set of ferroelectric memory cells 302.

In some embodiments, ferroelectric memory device 300 also includes a first driver 314 electrically connected to first set of ferroelectric memory cells 302 and a second driver 316 electrically connected to second set of ferroelectric memory cells 310, respectively, through the bit lines, word lines, and plate lines. First and second drivers 314 and 316 can include any suitable digital, analog, and/or mixed-signal circuits used for facilitating the operations of first and second sets of ferroelectric memory cells 302 and 310. For example, first and second drivers 314 and 316 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors).

In some embodiments, each of first and second drivers 314 and 316 includes a word line driving circuit, a plate line driving circuit, and a bit line driving circuit. The word line driving circuit can be configured to generate a plurality of word line signals and apply the plurality of word line signals to each word line, respectively, to select ferroelectric memory cells 304/312 electrically connected to the same word line (e.g., WL[0] in FIG. 3) on which the word line signal is applied. The plate line driving circuit can be configured to generate plate line signals and apply each plate line signal to a respective one of the plate lines (e.g., PL0 in FIG. 3) according to a plate line time sequence (i.e., a plate line coding). Each plate line signal can be applied across respective capacitor 308 through the respective plate line to polarize respective ferroelectric memory cell 304. The bit line driving circuit can be configured to generate bit line signals and apply a bit line signal to the respective bit line (e.g., BL[0] in FIG. 3) according to a bit line time sequence (i.e., a bit line coding) to write a valid state of data into capacitor 308 in respective ferroelectric memory cell 302 during the write operation. In some embodiments, each bit line signal is a voltage signal pulsed between 0 V and the supply voltage Vdd. The bit line signal is a binary signal of either 0 V or the Vdd, according to some embodiments. During the read operation, the bit line signal can be read through the respective bit line (e.g., BL[0] in FIG. 3) by the bit line driving circuit and compared with one or more reference voltages to determine a valid state of the data stored in capacitor 308.

In some embodiments, ferroelectric memory device 300 further includes a coordination unit 318 electrically connected to first and second drivers 314 and 316 and configured to coordinate first and second drivers 314 and 316 to drive first and second sets of ferroelectric memory cells 302 and 310 during the read and/or write operations according to various novel operation schemes as described below in detail. For example, as described above, coordination unit 318 may coordinate first and second drivers 314 and 316, such that first and second sets of ferroelectric memory cells 302 and 310 can be accessed in parallel.

Figure 4:
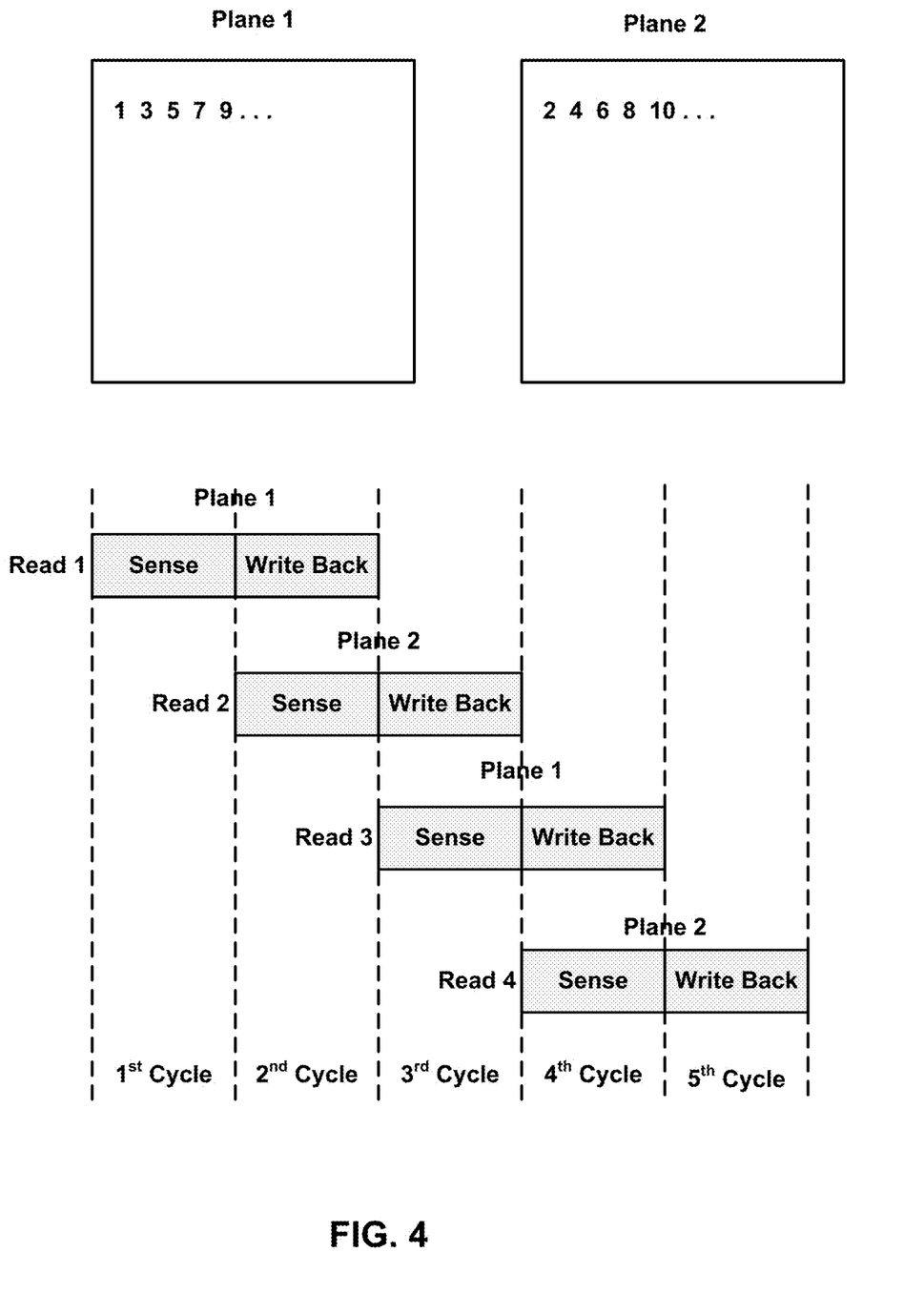
FIG. 4 illustrates a timing diagram of an exemplary read operation of ferroelectric memory cells including a first set of ferroelectric memory cells and a second set of ferroelectric memory cells in different locations that can be accessed in parallel, according to some embodiments of the present disclosure.
Figure 7:
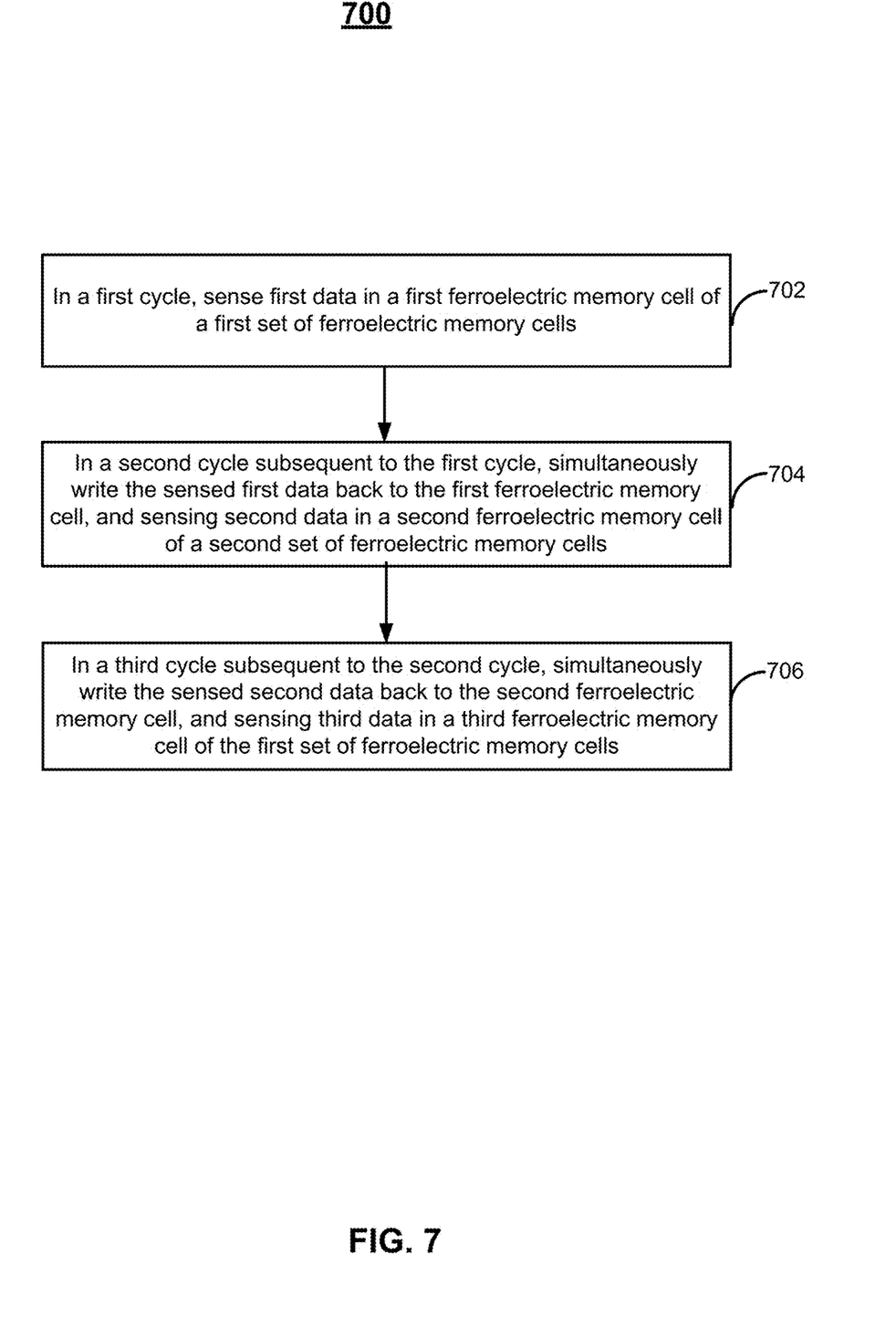
FIG. 7 is a flowchart of an exemplary method for reading ferroelectric memory cells, according to some embodiments of the present disclosure.

FIG. 4 illustrates a timing diagram of an exemplary read operation of ferroelectric memory cells including a first set of ferroelectric memory cells and a second set of ferroelectric memory cells in different locations that can be accessed in parallel, according to some embodiments of the present disclosure. FIG. 7 is a flowchart of an exemplary method 700 for reading ferroelectric memory cells, according to some embodiments of the present disclosure. Examples of ferroelectric memory cells depicted in FIGS. 4 and 7 include first and second sets of ferroelectric memory cells 302 and 310 depicted in FIG. 3. For ease of illustration, FIGS. 4 and 7 are described together. It should be understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which in a first cycle, first data in a first ferroelectric memory cell of the first set of ferroelectric memory cells is sensed. As illustrated in FIG. 4, the first set of ferroelectric memory cells (1, 3, 5, 7, 9, . . . ) can locate in the first plane (Plane 1), and the second set of ferroelectric memory cells (2, 4, 6, 8, 10, . . . ) can locate in the second plane (Plane 2). In some embodiments, each ferroelectric memory cell in Plane 1 stores the same data as a respective ferroelectric memory cell in Plane 2. Plane 1 and Plane 2 can be accessed in parallel. In some embodiments, each read operation (e.g., Read 1, Read 2, . . . ) is evenly divided into two steps for sensing and writing-back, respectively. In one example, each read cycle is about 10 ns, such as 10 ns. In the first cycle (sensing step) of the first read operation (Read 1), first data in the first ferroelectric memory cell (1) in Plane 1 can be sensed.

Method 700 proceeds to operation 704, as illustrated in FIG. 7, in which in a second cycle subsequent to the first cycle, the sensed first data back is written back to the first ferroelectric memory cell, and second data in a second ferroelectric memory cell of the second set of ferroelectric memory cells are simultaneously sensed. In some embodiments, the first data is the same as the second data. In some embodiments, durations of the first cycle and the second cycle are the same.

As illustrated in FIG. 4, in the second cycle subsequent to the first cycle, two operations are performed simultaneously in parallel due to the existence of two sets of ferroelectric memory cells that can be accessed in parallel: the sensed first data can be written back to the first ferroelectric memory cell (1) in Plane 1, and second data in the second ferroelectric memory cell (2) in Plane 2 can be simultaneously sensed. In some embodiments, the durations of the sensing step and the writing-back step are the same. Thus, the second cycle can be used for both the writing-back step of the first read operation (Read 1) and the sensing step of the second read operation (Read 2). In other words, the writing-back step (e.g., the writing-back step is Read 1) is "hidden behind" successive sensing steps (e.g., the sensing steps in Read 1 and Read 2), according to some embodiments. In some embodiments, the same data is stored in the first ferroelectric memory cell (1) in Plane 1 and the second ferroelectric memory cell (2) in Plane 2. That is, the first data and the second data in the first and second ferroelectric memory cells (1 and 2) are the same. Accordingly, the read access rate can be increased, for example, by twice.

Method 700 proceeds to operation 706, as illustrated in FIG. 7, in which in a third cycle subsequent to the second cycle, the sensed second data back is written back to the second ferroelectric memory cell, and third data in a third ferroelectric memory cell of the first set of ferroelectric memory cells is simultaneously sensed. In some embodiments, durations of the first cycle, the second cycle, and the third cycle are the same.

As illustrated in FIG. 4, in the third cycle subsequent to the second cycle, two operations are performed simultaneously in parallel due to the existence of two sets of ferroelectric memory cells that can be accessed in parallel: the sensed second data can be written back to the second ferroelectric memory cell (2) in Plane 2, and third data in the third ferroelectric memory cell (3) in Plane 1 can be simultaneously sensed. In some embodiments, the durations of the sensing step and the writing-back step are the same. Thus, the third cycle can be used for both the writing-back step of the second read operation (Read 2) and the sensing step of the third read operation (Read 3). In other words, the writing-back step (e.g., the writing-back step is Read 2) is "hidden behind" successive sensing steps (e.g., the sensing steps in Read 2 and Read 3), according to some embodiments. The same read scheme can be repeated as shown in FIG. 4 in the following cycles as needed. As a result, interleaving read operations can be "ping-ponged" between the first and second sets of ferroelectric memory cells in Plane 1 and Plane 2 to increase the read access rate.

Figure 5:
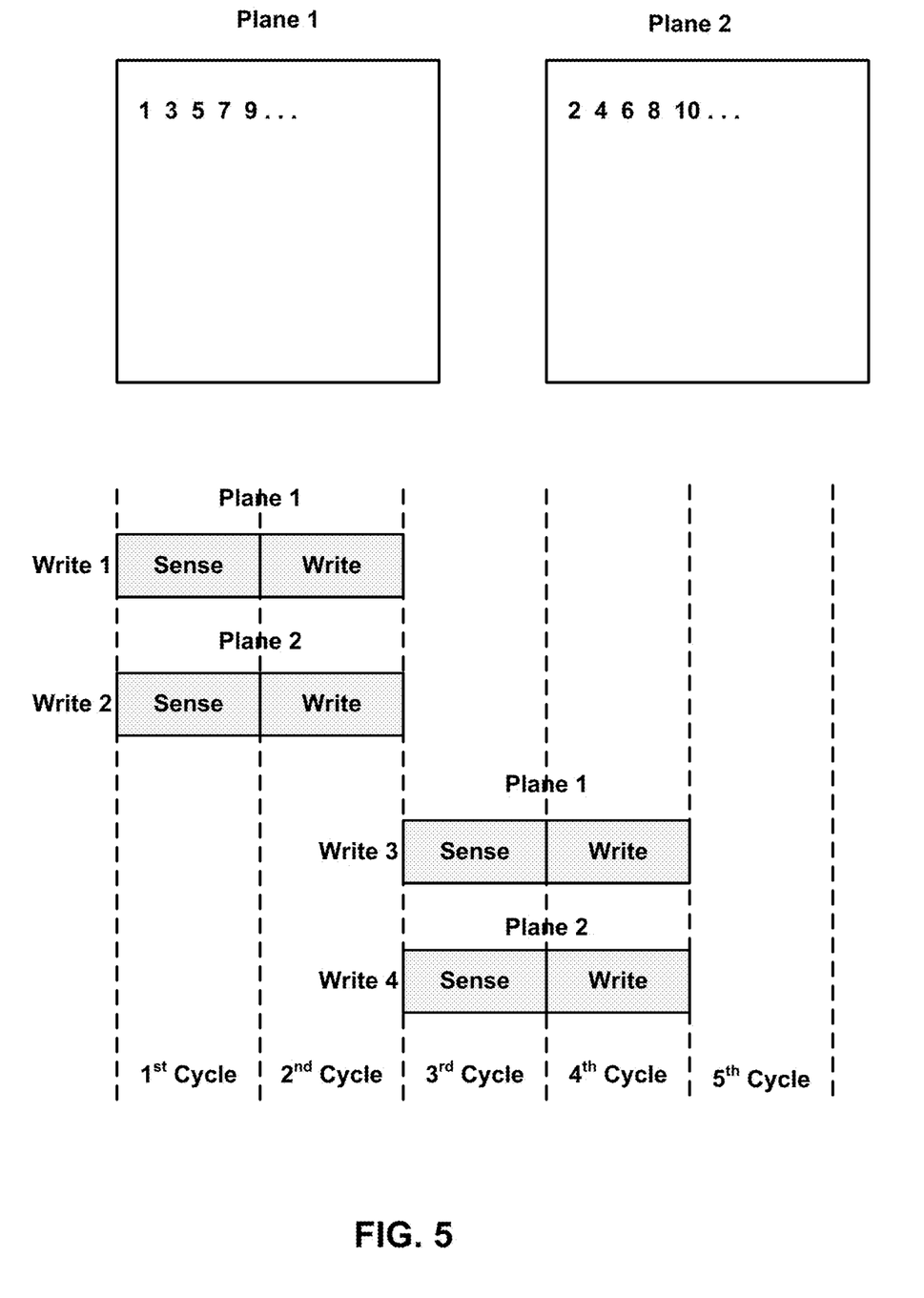
FIG. 5 illustrates a timing diagram of an exemplary write operation of ferroelectric memory cells including a first set of ferroelectric memory cells and a second set of ferroelectric memory cells in different locations that can be accessed in parallel, according to some embodiments of the present disclosure.
Figure 8:
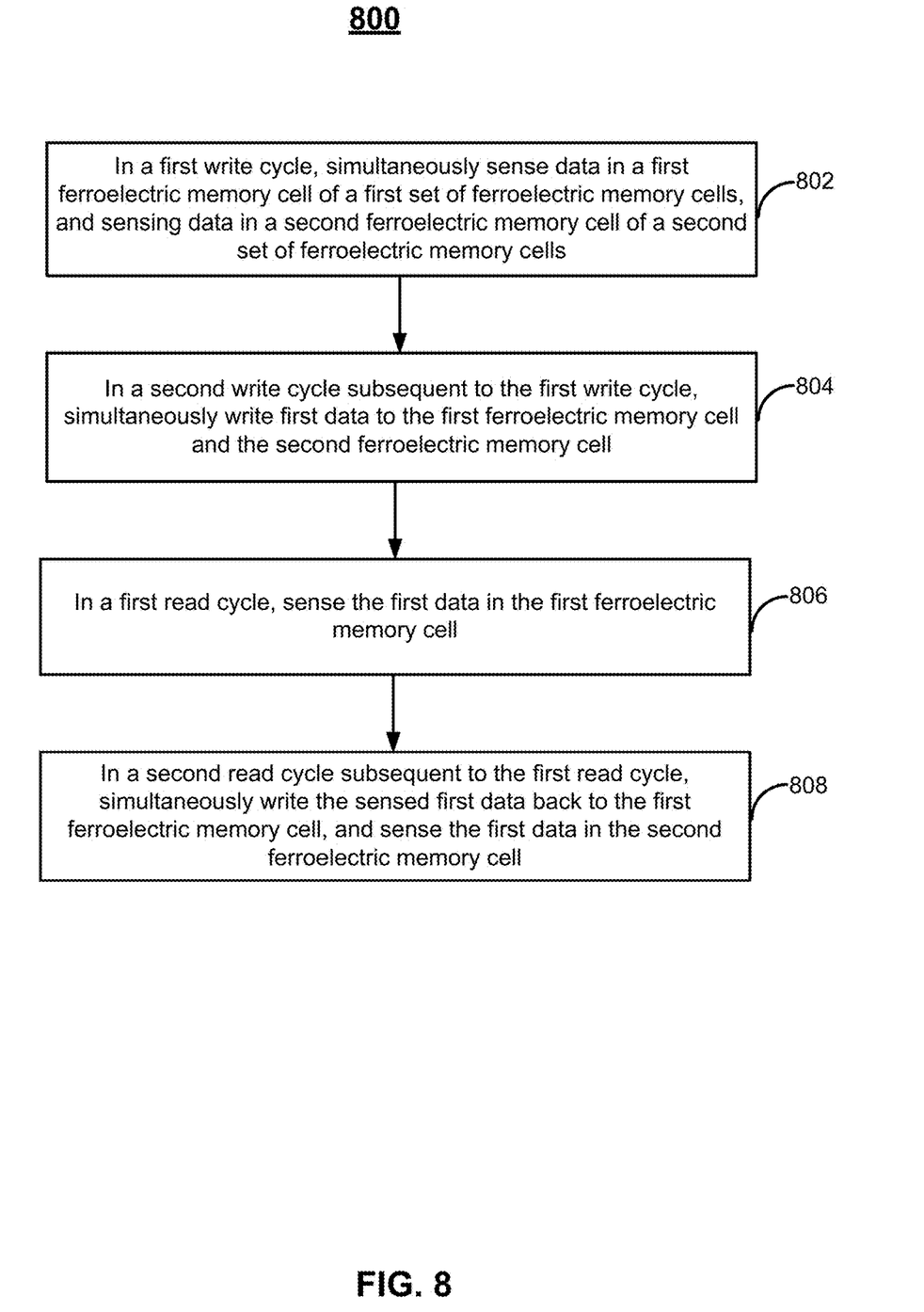
FIG. 8 is a flowchart of an exemplary method for operating ferroelectric memory cells, according to some embodiments of the present disclosure.

FIG. 5 illustrates a timing diagram of an exemplary write operation of ferroelectric memory cells including a first set of ferroelectric memory cells and a second set of ferroelectric memory cells in different locations that can be accessed in parallel, according to some embodiments of the present disclosure. FIG. 8 is a flowchart of an exemplary method 800 for operating ferroelectric memory cells, according to some embodiments of the present disclosure. Examples of ferroelectric memory cells depicted in FIGS. 5 and 8 include first and second sets of ferroelectric memory cells 302 and 310 depicted in FIG. 3. For ease of illustration, FIGS. 4, 5, and 8 are described together. It should be understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which in a first write cycle, data in a first ferroelectric memory cell of the first set of ferroelectric memory cells and data in a second ferroelectric memory cell of the second set of ferroelectric memory cells are simultaneously sensed. As described above, in some embodiments, a write operation includes a sensing step prior to the writing step. As illustrated in FIG. 5, each write operation (e.g., Write 1, Write 2, . . . ) is evenly divided into two write steps for sensing and writing, respectively. The first set of ferroelectric memory cells (1, 3, 5, 7, 9, . . . ) can locate in the first plane (Plane 1), and the second set of ferroelectric memory cells (2, 4, 6, 8, 10, . . . ) can locate in the second plane (Plane 2). In some embodiments, Plane 1 and Plane 2 can be accessed in parallel so as to write the same data in a ferroelectric memory cell in Plane 1 and in a respective ferroelectric memory cell in Plane 2. That is, the identical data can be written into the two sets of ferroelectric memory cells at the same time. In the first cycle, data in the first ferroelectric memory cell (1) in Plane 1 and data in the second ferroelectric memory cell (2) in Plane 2 can be simultaneously sensed. That is, the sensing step of the first write operation (Write 1) to Plane 1 and the sensing step of the second write operation (Write 2) to Plane 2 can be performed at the same time, e.g., in the first cycle. It is understood that the additional data may be sensed from other ferroelectric memory cells (e.g., in the same page) at the same time as the first and second ferroelectric memory cells (1 and 2) and need to be written back to the original locations.

Method 800 proceeds to operation 804, as illustrated in FIG. 8, in which in a second write cycle subsequent to the first write cycle, first data is simultaneously written to the first ferroelectric memory cell and the second ferroelectric memory cell. In some embodiments, durations of the first write cycle and the second write cycle are the same. For example, each duration may be about 10 ns, such as 10 ns. As illustrated in FIG. 5, in the second cycle subsequent to the first cycle, the same first data is simultaneously written to the first ferroelectric memory cell (1) in Plane 1 and the second ferroelectric memory cell (2) in Plane 2. That is, the writing cycle of the first write operation (Write 1) to Plane 1 and the writing cycle of the second write operation (Write 2) to Plane 2 can be performed at the same time, e.g., in the second cycle, to write identical data to two different ferroelectric memory cells. The same write scheme can be repeated as shown in FIG. 5 in the following cycles as needed. As a result, the writing access rate is not reduced compared with normal ferroelectric memory write operation.

Method 800 proceeds to operation 806, as illustrated in FIG. 8, in which in a first read cycle, the first data in the first ferroelectric memory cell is sensed. As illustrated in FIG. 4, in the first cycle (sensing step) of the first read operation (Read 1), first data in the first ferroelectric memory cell (1) in Plane 1 can be sensed.

Method 800 proceeds to operation 808, as illustrated in FIG. 8, in which in a second read cycle subsequent to the first read cycle, the sensed first data is written back to the first ferroelectric memory cell, and the first data in the second ferroelectric memory cell is simultaneously sensed. In some embodiments, durations of the first read cycle and the second read cycle are the same. In some embodiments, durations of each read cycle and each write cycle are the same. For example, each duration may be about 10 ns, such as 10 ns. As illustrated in FIG. 4, in the second cycle, the sensed first data can be written back to the first ferroelectric memory cell (1) in Plane 1, and the same first data in the second ferroelectric memory cell (2) in Plane 2 can be simultaneously sensed.

Although not shown in FIG. 8, the same operation scheme can be repeated as in the following cycles as needed. For example, in a third write cycle subsequent to the second write cycle, data in a third ferroelectric memory cell of the first set of ferroelectric memory cells and data in a fourth ferroelectric memory cell of the second set of ferroelectric memory cells may be simultaneously sensed. In a fourth write cycle subsequent to the third write cycle, second data may be simultaneously written to the third ferroelectric memory cell and the fourth ferroelectric memory cell. In a third read cycle subsequent to the second read cycle, the sensed first data may be written back to the second ferroelectric memory cell, and the second data in the third ferroelectric memory cell may be simultaneously sensed.

Figure 6:
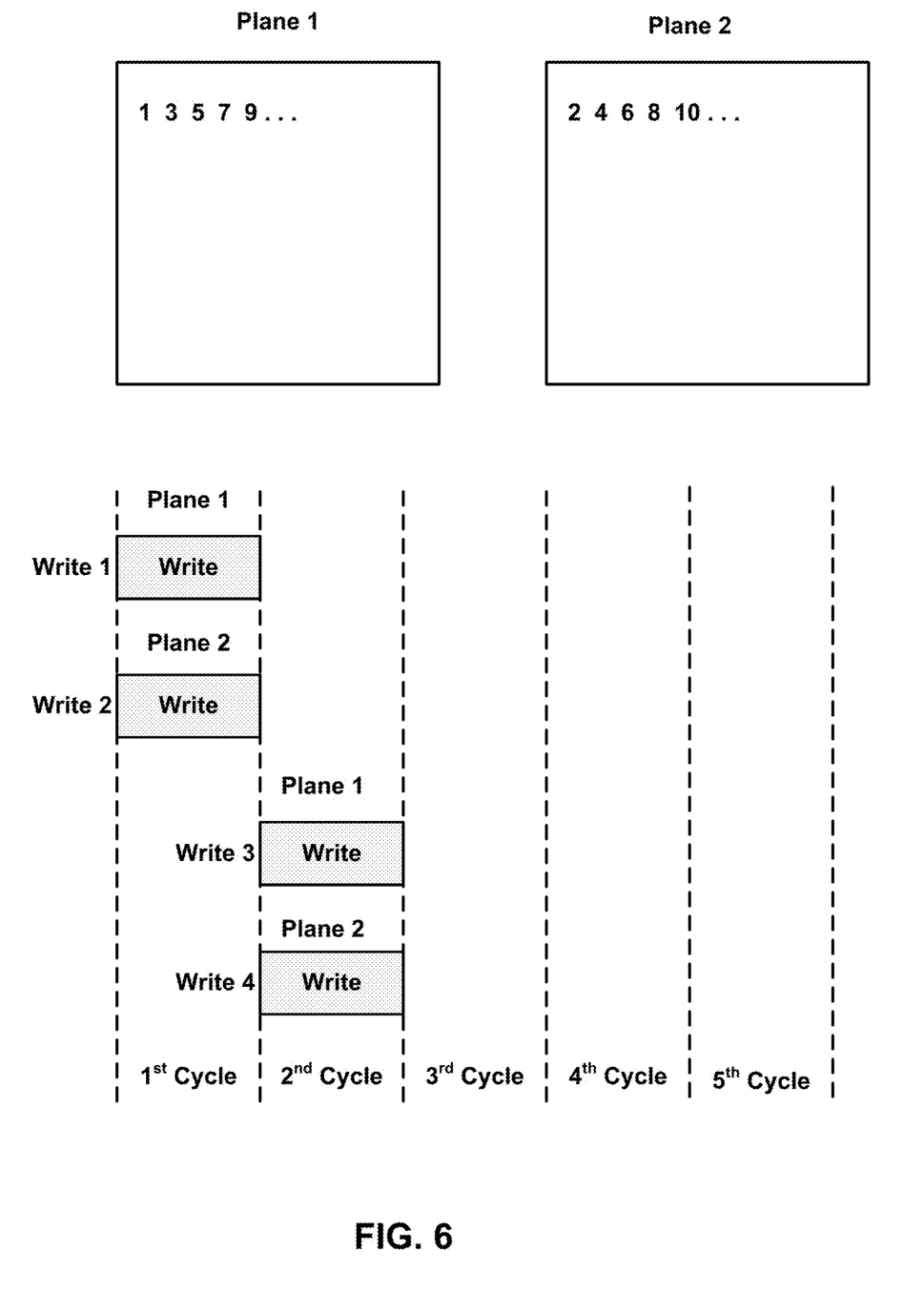
FIG. 6 illustrates a timing diagram of another exemplary write operation of ferroelectric memory cells including a first set of ferroelectric memory cells and a second set of ferroelectric memory cells in different locations that can be accessed in parallel, according to some embodiments of the present disclosure.
Figure 9:
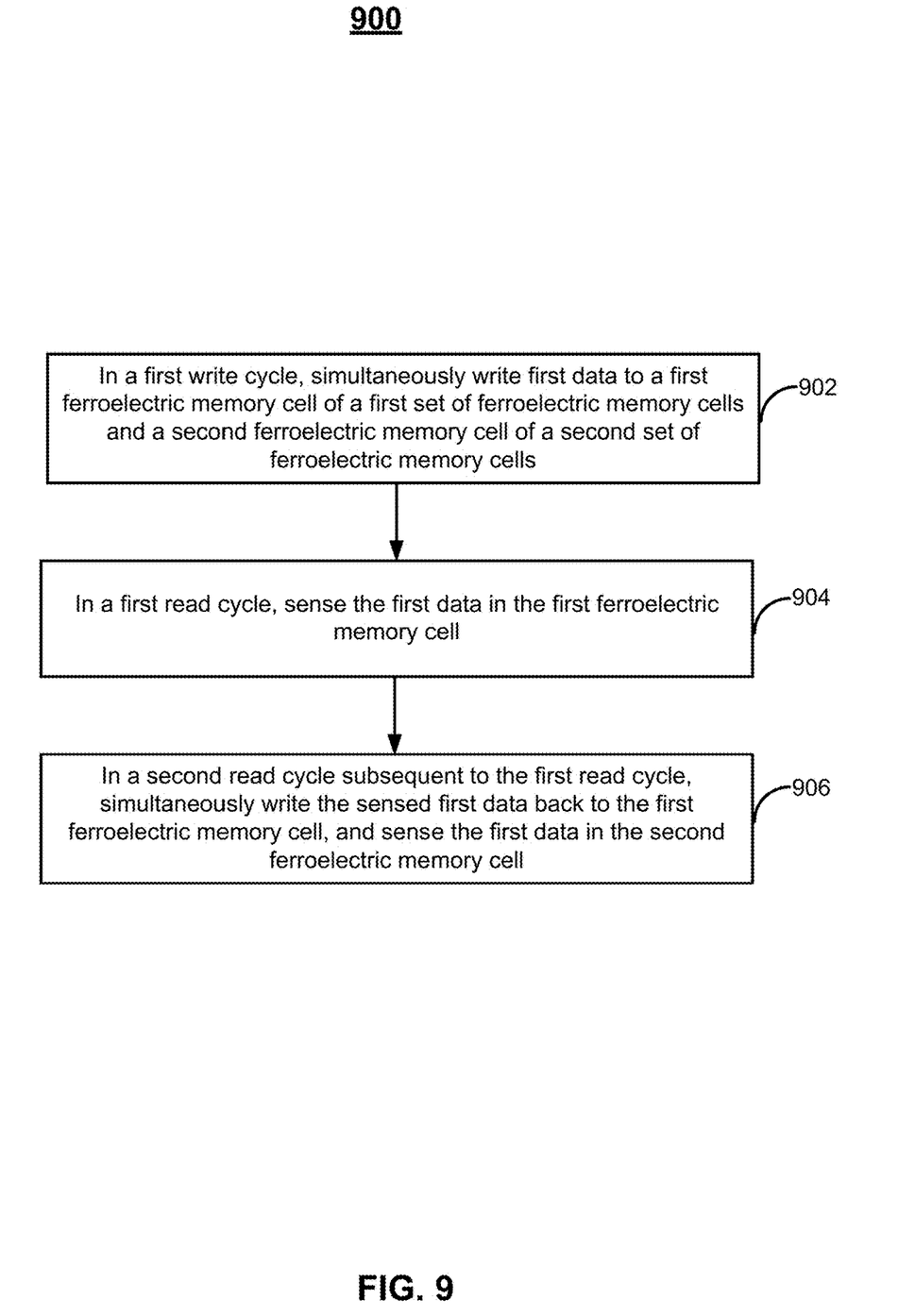
FIG. 9 is a flowchart of another exemplary method for operating ferroelectric memory cells, according to some embodiments of the present disclosure.

FIG. 6 illustrates a timing diagram of another exemplary write operation of ferroelectric memory cells including a first set of ferroelectric memory cells and a second set of ferroelectric memory cells in different locations that can be accessed in parallel, according to some embodiments of the present disclosure. FIG. 9 is a flowchart of an exemplary method 900 for operating ferroelectric memory cells, according to some embodiments of the present disclosure. Examples of ferroelectric memory cells depicted in FIGS. 6 and 9 include first and second sets of ferroelectric memory cells 302 and 310 depicted in FIG. 3. For ease of illustration, FIGS. 4, 6, and 9 are described together. It should be understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which in a first write cycle, first data is simultaneously written to a first ferroelectric memory cell of the first set of ferroelectric memory cells and a second ferroelectric memory cell of the second set of ferroelectric memory cells. As illustrated in FIG. 6, in the first cycle, the same first data can be simultaneously written to the first ferroelectric memory cell (1) in Plane 1 and the second ferroelectric memory cell (2) in Plane 2. Different from the example shown in FIG. 5 in which each write cycle includes a sensing step prior to the writing step, the sensing step can be omitted from each write cycle in FIG. 6 by, for example, including additional decoding circuits. That is, the first write operation (Write 1) to Plane 1 and the second write operation (Write 2) to Plane 2 can be performed at the same time, e.g., in the first cycle, to write identical data to two different ferroelectric memory cells. The same write scheme can be repeated as shown in FIG. 6 in the following cycles as needed. As a result, the writing access rate can be increased, for example, by twice by skipping the sensing step of each write operation.

Method 900 proceeds to operation 904, as illustrated in FIG. 9, in which in a first read cycle, the first data in the first ferroelectric memory cell is sensed. As illustrated in FIG. 4, in the first cycle (sensing step) of the first read operation (Read 1), first data in the first ferroelectric memory cell (1) in Plane 1 can be sensed.

Method 900 proceeds to operation 906, as illustrated in FIG. 9, in which in a second read cycle subsequent to the first read cycle, the sensed first data back is written back to the first ferroelectric memory cell, and the first data in the second ferroelectric memory cell is simultaneously sensed. In some embodiments, durations of the first read cycle and the second read cycle are the same. In some embodiments, durations of each read cycle and each write cycle are the same. For example, each duration may be about 10 ns, such as 10 ns. As illustrated in FIG. 4, in the second cycle, the sensed first data can be written back to the first ferroelectric memory cell (1) in Plane 1, and the same first data in the second ferroelectric memory cell (2) in Plane 2 can be simultaneously sensed.

Although not shown in FIG. 9, the same operation scheme can be repeated as in the following cycles as needed. For example, in a second write cycle subsequent to the first write cycle, second data may be simultaneously written to a third ferroelectric memory cell of the first set of ferroelectric memory cells and a fourth ferroelectric memory cell of the second set of ferroelectric memory cells. In a third read cycle subsequent to the second read cycle, the sensed first data may be written back to the second ferroelectric memory cell, and the second data in the third ferroelectric memory cell may be simultaneously sensed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for reading ferroelectric memory cells comprising a first set of ferroelectric memory cells and a second set of ferroelectric memory cells, the method comprising:
   in a first cycle, sensing first data in a first ferroelectric memory cell of the first set of ferroelectric memory cells; and
   in a second cycle subsequent to the first cycle, simultaneously writing the sensed first data back to the first ferroelectric memory cell, and sensing second data in a second ferroelectric memory cell of the second set of ferroelectric memory cells, wherein
   each ferroelectric memory cell of the first set of ferroelectric memory cells stores same data as a respective ferroelectric memory cell of the second set of ferroelectric memory cells such that the respective ferroelectric memory cell of the second set of ferroelectric memory cells is a replica of the ferroelectric memory cell of the first set of ferroelectric memory cells.

2. The method of claim 1, further comprising, in a third cycle subsequent to the second cycle, simultaneously writing the sensed second data back to the second ferroelectric memory cell, and sensing third data in a third ferroelectric memory cell of the first set of ferroelectric memory cells.

3. The method of claim 1, wherein the first data is the same as the second data.

4. The method of claim 1, wherein the first set of ferroelectric memory cells and the second set of ferroelectric memory cells are in different locations that can be accessed in parallel.

5. The method of claim 1, wherein durations of the first cycle and the second cycle are the same.

6. The method of claim 5, wherein each duration is about 10 ns.

7. A method for operating ferroelectric memory cells comprising a first set of ferroelectric, memory cells and a second set of ferroelectric memory cells, the method comprising:
   in a first write cycle, simultaneously sensing stored data in a first ferroelectric memory cell of the first set of ferroelectric memory cells, and sensing stored data in a second ferroelectric memory cell of the second set of ferroelectric memory cells;
   in a second write cycle subsequent to the first write cycle, simultaneously writing first data to the first ferroelectric memory cell and the second ferroelectric memory cell, the first data being different from the stored data in the first ferroelectric memory cell and the second ferroelectric memory cell;
   in a first read cycle, sensing the first data in the first ferroelectric memory cell; and
   in a second read cycle subsequent to the first read cycle, simultaneously writing the sensed first data back to the first ferroelectric memory cell, and sensing the first data in the second ferroelectric memory cell.

8. The method of claim 7, further comprising:
   in a third write cycle subsequent to the second write cycle, simultaneously sensing stored data in a third ferroelectric memory cell of the first set of ferroelectric memory cells, and sensing stored data in a fourth ferroelectric memory cell of the second set of ferroelectric memory cells; and
   in a fourth write cycle subsequent to the third write cycle, simultaneously writing second data to the third ferroelectric memory cell and the fourth ferroelectric memory cell, the second data being different from the stored data in the third ferroelectric memory cell and the fourth ferroelectric memory cell.

9. The method of claim 8, further comprising, in a third read cycle subsequent to the second read cycle, simultaneously writing the sensed first data back to the second ferroelectric memory cell, and sensing the second data in the third ferroelectric memory cell.

10. The method of claim 7, wherein the first set of ferroelectric memory cells and the second set of ferroelectric memory cells are in different locations that can be accessed in parallel.

11. The method of claim 7, wherein durations of the first read cycle and the second read cycle are the same.

12. The method of claim 11, wherein durations of the first write cycle and the second write cycle are the same.

13. The method of claim 12, wherein each duration is about 10 ns.

* * * * *